United States Patent
Kubota et al.

(10) Patent No.: US 8,629,601 B2
(45) Date of Patent: Jan. 14, 2014

(54) PIEZOELECTRIC OSCILLATOR

(75) Inventors: Hajime Kubota, Kawasaki (JP);
Masayuki Itoh, Kawasaki (JP);
Masakazu Kishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 509 days.

(21) Appl. No.: 12/908,362

(22) Filed: Oct. 20, 2010

(65) Prior Publication Data

US 2011/0095656 A1    Apr. 28, 2011

(30) Foreign Application Priority Data

Oct. 23, 2009 (JP) ................. 2009-244640

(51) Int. Cl.
*H01L 41/08* (2006.01)
*H01L 41/053* (2006.01)

(52) U.S. Cl.
CPC ................... *H01L 41/053* (2013.01)
USPC ......................... 310/344; 310/348

(58) Field of Classification Search
CPC .................................................. H01L 41/053
USPC .................................. 310/334, 348
See application file for complete search history.

(56) References Cited

U.S. PATENT DOCUMENTS 6,943,419 B2 *   9/2005   Wong et al. .................... 257/416
7,259,500 B2 *   8/2007   Iwamoto et al. ............... 310/340
8,058,778 B2 *  11/2011   Numata et al. ................. 310/344
2002/0033652 A1  3/2002  Serizawa
2010/0052473 A1 *  3/2010  Kimura et al. ............. 310/313 R
2011/0193646 A1 *  8/2011  Sugama et al. ............... 331/158

FOREIGN PATENT DOCUMENTS

| CN | 1343043 | | 4/2002 |
| JP | 2004135196 A | * | 4/2004 |
| JP | 2005-260525 | | 9/2005 |
| JP | 2006-80599 A | | 3/2006 |
| JP | 2006080599 A | * | 3/2006 |
| JP | 2008-42512 A | | 2/2008 |
| JP | 2008193154 A | * | 8/2008 |
| JP | 4214753 B | | 1/2009 |
| JP | 2010056671 A | * | 3/2010 |

OTHER PUBLICATIONS

"Transparent Ceramics", http://www.covalent.co.jp/eng/rd/developments/transparent.html.
"Chinese Office Action" mailed by Chinese Patent Office and corresponding to Chinese Application No. 201010518508.2 on Mar. 11, 2013, with English translation.

* cited by examiner

*Primary Examiner* — J. San Martin
(74) *Attorney, Agent, or Firm* — Fujitsu Patent Center (57) ABSTRACT

A piezoelectric oscillator includes: a package including a floor surface and a step portion thereinside; a conductive adhesive applied on the step portion; and a piezoelectric vibrator including one end placed on the step portion via the conductive adhesive. The floor surface is provided with a recess filled with a resin material having a thermal deformation property. The package includes a sidewall having transparency.

3 Claims, 6 Drawing Sheets

PIEZOELECTRIC OSCILLATOR

CROSS-REFERENCE TO RELATED APPLICATION

This application is based upon and claims the benefit of priority of the prior Japanese Patent Application No. 2009-244640, filed on Oct. 23, 2009, the entire contents of which are incorporated herein by reference.

FIELD

The embodiments discussed herein are related to a piezoelectric oscillator and a manufacturing method of the piezoelectric oscillator.

BACKGROUND

In order to generate clock signals in information equipments, a piezoelectric oscillator is widely used, in which a piezoelectric material such as a crystal or barium titanate is used. The piezoelectric oscillator includes a substrate made of the piezoelectric material having a predetermined length and thickness, excitation electrode patterns formed on both surfaces of the substrate, and leading lines that extend from the electrode patterns. The substrate functions as a piezoelectric vibrator. One part of the substrate is mechanically fixed inside a package, and another part of the substrate is oscillated mechanically.

One of known methods for mechanically supporting the piezoelectric vibrator is a cantilever method, in which one end of the piezoelectric vibrator is not mechanically fixed so as to be a free end.

Figure 4A:
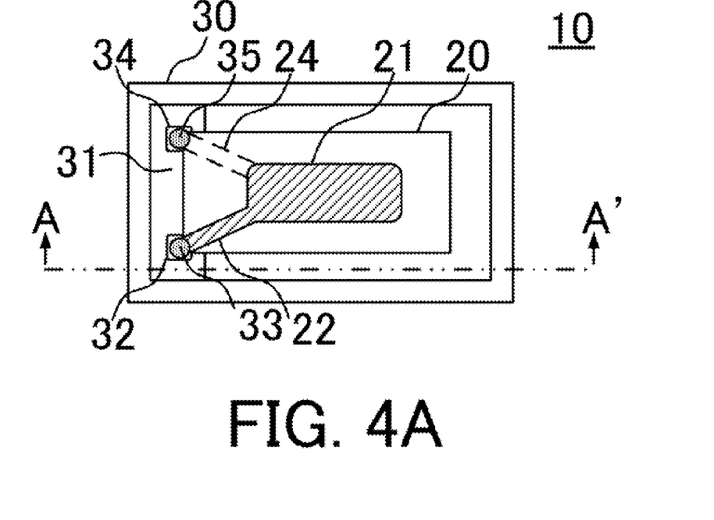
FIGS. 4A and 4B are diagrams illustrating a plan view and a lateral view, respectively, of a piezoelectric oscillator, without a lid, including a piezoelectric vibrator in a cantilever fashion.
Figure 4B:
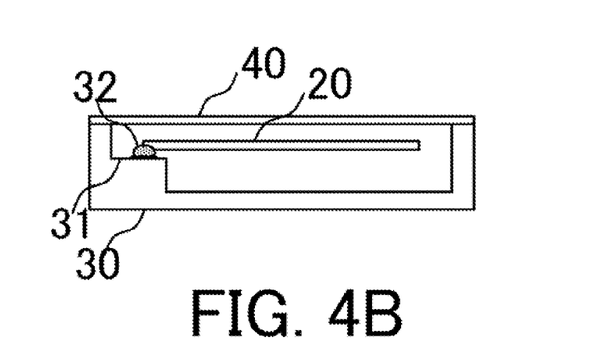

FIG. 4A illustrates a plan view of a piezoelectric oscillator 10, without a lid, including a piezoelectric vibrator 20 in a cantilever fashion. FIG. 4B illustrates a lateral view of the piezoelectric oscillator 10, with a lid 40, cut along a line A-A' in FIG. 4A. The piezoelectric vibrator 20 of the piezoelectric oscillator 10 is provided inside a package 30. The piezoelectric vibrator 20 is a substrate made of a crystal or the like. An electrode pattern 21 and a leading line pattern 22 that extends from the electrode pattern 21 are formed on the upper surface of the piezoelectric vibrator 20 by a thin film formation technique such as a metallic vapor deposition technique. Similarly, a lower surface electrode pattern (not illustrated) and a leading line pattern 24 that extends from the lower surface electrode pattern are formed on the lower surface of the piezoelectric vibrator 20. The package 30 is made of a material such as ceramic and has a step 31 formed therein. Metal pads 32 and 34 are formed on the step 31 by metalization. Conductive adhesives 33 and 35 are respectively applied to the metal pads 32 and 34. Then, in this state, ends of the leading line patterns 22 and 24 formed on the piezoelectric vibrator 20 are respectively placed on the conductive adhesives 33 and 35, and then the conductive adhesives 33 and 35 are cured. The curing of the conductive adhesives 33 and 35 allows the piezoelectric vibrator 20 to be supported on the step 31 substantially horizontally in a cantilever fashion.

Each of the metal pads 32 and 34 formed on the step 31 is connected to an external electrode (not illustrated), which is formed on the bottom of the package 30 by metallization, through a conductor (not illustrated) provided inside the package 30. The external electrode applies a voltage to the piezoelectric oscillator 10 provided on a circuit substrate. The piezoelectric vibrator 20 is deformed by a voltage effect and is therefore oscillated at a resonant frequency, thereby obtaining a voltage signal corresponding to the frequency.

Figure 5:
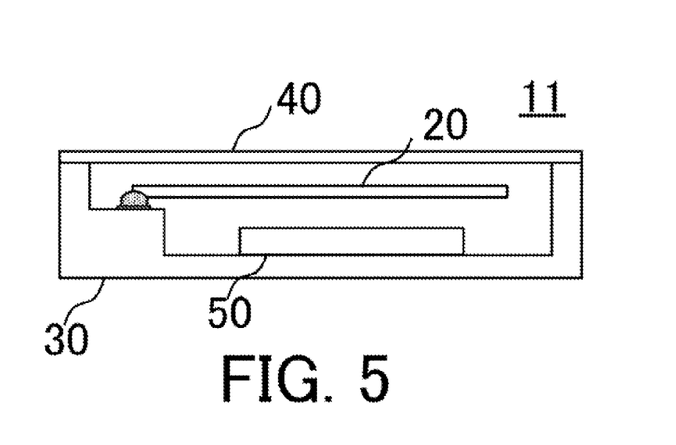
FIG. 5 is a diagram illustrating a lateral view of a piezoelectric oscillator accommodated with a semiconductor device.

In this example, only the piezoelectric vibrator is accommodated in the package, but a semiconductor device of an oscillation circuit may be accommodated in the package along with the piezoelectric vibrator. FIG. 5 illustrates a lateral view of a piezoelectric oscillator 11 accommodated with a semiconductor device 50 therein. This configuration allows a packaging density on the circuit substrate to be improved. Because the semiconductor device 50 in addition to the piezoelectric vibrator 20 is accommodated in the package 30, the free space inside the package 30 becomes smaller. Therefore, control for keeping the piezoelectric vibrator 20 not to contact a lid 40 and the semiconductor device 50 becomes more difficult.

A ceramic package made of alumina ($Al_2O_3$) is typically used as the package of the piezoelectric oscillator.

The package made of alumina is nontransparent, however, a transparent package made of a hard glass material is also known. Japanese Laid-open Patent Publication No. 2008-42512 discloses a related technique.

A known method for forming a cantilever piezoelectric vibrator includes the following processes: placing a free end of the piezoelectric vibrator on a temporary supporting member (pillow member), which is positioned on a floor surface inside the package, made of a resin having a heat shrinkage property or a thermal deformation property; placing a supported end of the piezoelectric vibrator on the conductive adhesives applied to the step of the package; curing the conductive adhesives; and deforming the temporary supporting member by heating to form a gap between the piezoelectric vibrator and the temporary supporting member. The temporary supporting member is separated from the piezoelectric vibrator after the fixation of the supported end, thereby allowing the piezoelectric vibrator to be supported substantially horizontally in a cantilever fashion. Accordingly, contact of the free end with the package is suppressed. Japanese Laid-open Patent Publication No. 2006-80599 and Japanese Patent No. 4214753 disclose relates techniques.

One end of the cantilever piezoelectric vibrator is free, and this allows the piezoelectric vibrator not to be mechanically restrained. Therefore, the cantilever piezoelectric vibrator is widely used because the supported portion is less affected by stress due to vibration. However, recently, the size of electronic devices has been decreasing, and electronic components have been required to have a low height. Accordingly, available space in the package to place the piezoelectric vibrator is reduced. In cases where the piezoelectric vibrator is fixed while being tilted, the piezoelectric vibrator may contact the package. Therefore, the piezoelectric vibrator is required to be more accurately supported horizontally in a cantilever fashion. Also in cases where the semiconductor device of the oscillation circuit is accommodated in the package along with the piezoelectric vibrator, the same requirement arises as in the case in which electronic components are required to have a low height.

SUMMARY

According to an aspect of the present invention, provided is a piezoelectric oscillator and a manufacturing method thereof. The piezoelectric oscillator includes: a package including a floor surface and a step portion thereinside; a conductive adhesive applied on the step portion; and a piezoelectric vibrator including one end placed on the step portion via the conductive adhesive. The floor surface is provided with a recess filled with a resin material having a thermal deformation property. The package includes a sidewall having transparency.

The manufacturing method includes: applying a conductive adhesive to a step formed inside a package made of a transparent material; positioning a temporary supporting member on a floor surface inside the package such that a height of a top of the temporary supporting member is higher than a height of a top of the conductive adhesive applied to the step, the temporary supporting member being made of a resin having a thermal deformation property; placing one end of a piezoelectric vibrator on the conductive adhesive applied to the step, the one end becoming a supported end of the piezoelectric vibrator; placing another end of the piezoelectric vibrator on the temporary supporting member, the another end becoming a free end of the piezoelectric vibrator; adjusting a height of the free end of the piezoelectric vibrator so as to be lower by a predetermined difference than a height of the supported end of the piezoelectric vibrator by radiating a laser to the temporary supporting member through a side wall of the package to thermally soften the temporary supporting member; curing the conductive adhesive by heating at a first temperature; and deforming the temporary supporting member by heating at a second temperature to form a gap between the piezoelectric vibrator and the temporary supporting member.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In a conventional method for supporting the cantilever piezoelectric vibrator, one end of the piezoelectric vibrator is placed on the conductive adhesive applied to the step of the package, and another end thereof is placed on the temporary supporting member. Then, the piezoelectric vibrator is heated to cure the conductive adhesive in this state. The conductive adhesive is shrunk by the heating and then is cured while the end of the piezoelectric vibrator on the temporary supporting member is raised. Accordingly, in order to prevent the piezoelectric vibrator from contacting the lid or the like of the package, strict control of the height of the applied conductive adhesive and the height of the temporary supporting member may be required. For example, it is considered that control of the viscosity and amount of conductive adhesive applied may be required and that temperature control during heating may be required, and such a requirement generates a problem that a lot of time is spent for such control.

After the conductive adhesive is cured by heating, the temporary supporting member is thermally deformed by heating at a higher temperature to form the gap between the piezoelectric vibrator and the temporary supporting member. The temporary supporting member deformed to form the gap is left in the package, and then the lid is sealed. When the temporary supporting member is fixed to the floor surface inside the package, no problem may arise. If the temporary supporting member is removed from the floor surface during transportation or handling in a mounting process, the temporary supporting member may move about inside the package, and may adhere to the piezoelectric vibrator. In this case, the piezoelectric oscillator may be unsteadily oscillated, thereby causing a problem.

Figure 1:
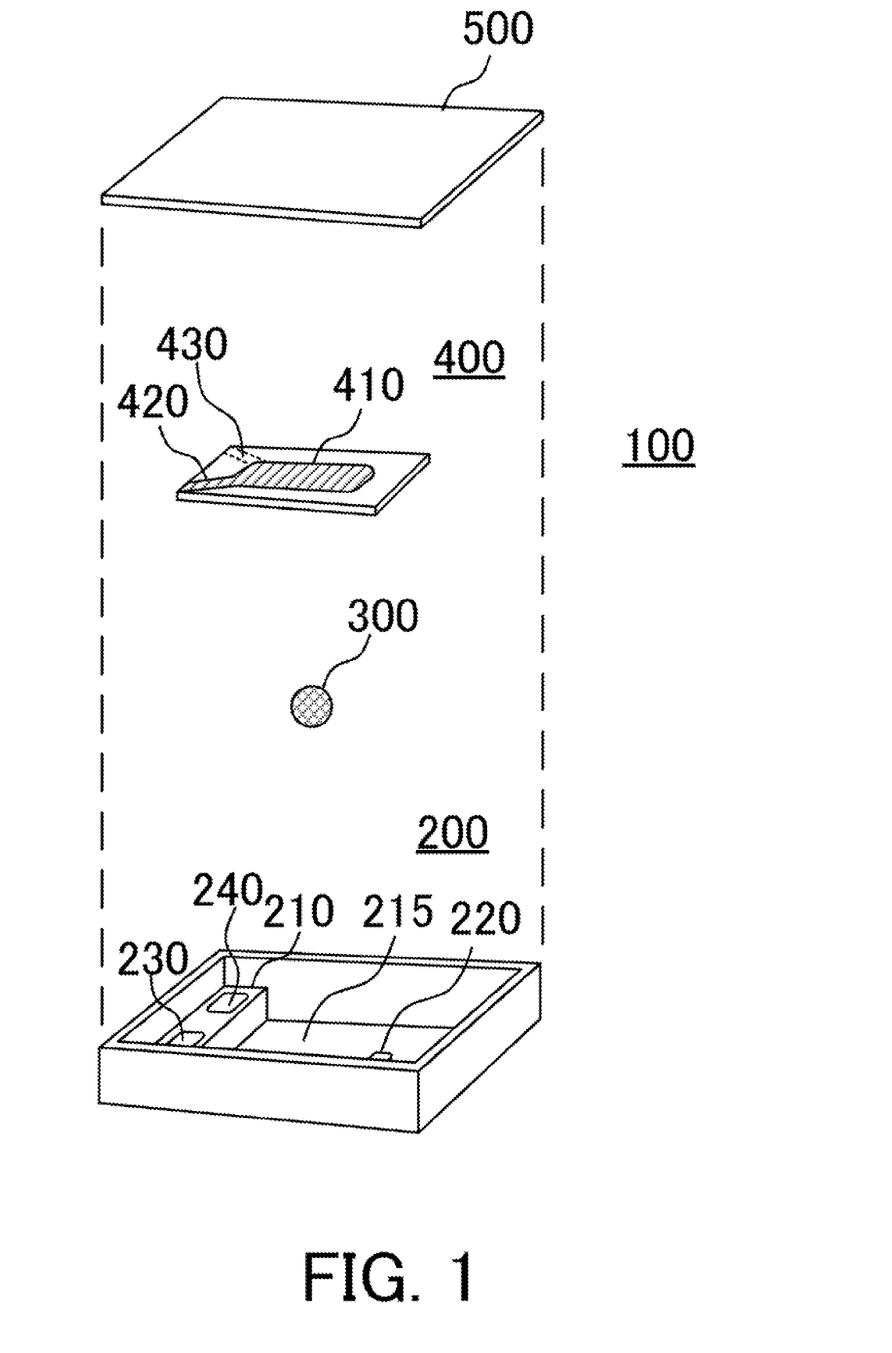
FIG. 1 is a diagram illustrating an exploded perspective view of a piezoelectric oscillator according to an embodiment of the present invention.

FIG. 1 illustrates components of a piezoelectric oscillator 100 according to the present embodiment. A package 200 made of transparent material, such as transparent ceramic, has a step 210 therein. Metal pads 230 and 240 are formed on the step 210 by metallization. In addition, the package 200 has a floor surface 215 and has an opening 220 formed on the floor surface 215. The opening 220 has a predetermined shape and size, for example, a 0.5 mm square. The opening 220 leads into a hollow portion (not illustrated) having a size larger than the predetermined size.

For example, the ceramic used for the package 200 may be produced from yttrium oxide ($Y_2O_3$) by adding an additive and sintering, and the produced ceramic is transparent. Such transparent ceramic is disclosed in the following web site: http//www.covalent.co.jp/eng/rd/developments/transparent.html, for example. An external electrode (not illustrated) used for the piezoelectric oscillator 100 is provided on the bottom surface of the package 200, and the external electrode is electrically connected to the metal pads 230 and 240 through internal wiring.

A temporary supporting member 300 temporarily supports a piezoelectric vibrator 400. For example, the temporary supporting member 300 is prepared by forming a thermoplastic fluorine resin into a spherical shape having a size of 0.8 mm and is thermally deformed at a temperature in the range from 200° C. to 400° C.

In the embodiment, a quartz plate having a length of 4.5 mm and a width of 2 mm is used for the piezoelectric vibrator 400. An evaporated metal film is deposited as an electrode pattern 410 on an upper surface of the quartz plate, and a leading line pattern 420 is formed so as to extend from the electrode pattern 410 to the left end of the quartz plate. A lower surface electrode pattern (not illustrated) is formed on a lower surface of the quartz plate as in the case of the electrode pattern 410, and a leading line pattern 430 is formed so as to extend from the lower surface electrode pattern to the left end of the quartz plate. When the piezoelectric vibrator 400 is attached to the package 200, the left end of the piezoelectric vibrator 400 becomes the supported end which is supported by a conductive adhesive, and the right end thereof becomes the free end. The conductive adhesives are applied to the metal pads 230 and 240 and connect the leading line patterns 420 and 430 of the piezoelectric vibrator 400 to the metal pads 230 and 240, respectively. In addition, the conductive adhesives mechanically fix the piezoelectric vibrator 400 to the step 210.

A lid 500 is made of alumina ceramic and is glass-sealed with the upper surface of the package 200.

Examples of the conductive adhesive include an epoxy adhesive, a urethane adhesive, and a silicon adhesive based on a type of binder. An epoxy adhesive that exhibits high hardness is employed in the present embodiment.

FIGS. 2A to 2H illustrate a process for manufacturing the piezoelectric oscillator 100 according to the present embodiment. A method of manufacturing the piezoelectric oscillator 100, which has been discussed with reference to FIG. 1, will be discussed in order of the process steps with reference FIGS. 2A to 2H. Each of FIGS. 2A to 2H includes a plan view and a lateral view thereof cut along a line B-B' in the plan view.

Figure 2A:
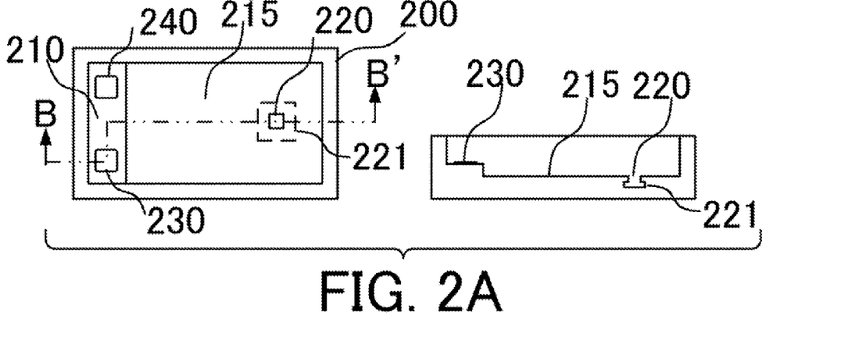
FIGS. 2A to 2H are diagrams illustrating a process for manufacturing a piezoelectric oscillator according to an embodiment of the present invention, each figure including a plan view and a lateral view of the piezoelectric oscillator.

FIG. 2A illustrates a plan view and a lateral view of the package 200 made of the transparent ceramic. In the package 200, the above discussed metal pads 230 and 240 are formed on the step 210, and the opening 220 leading into the hollow portion 221 is formed on the floor surface 215.

Figure 2B:
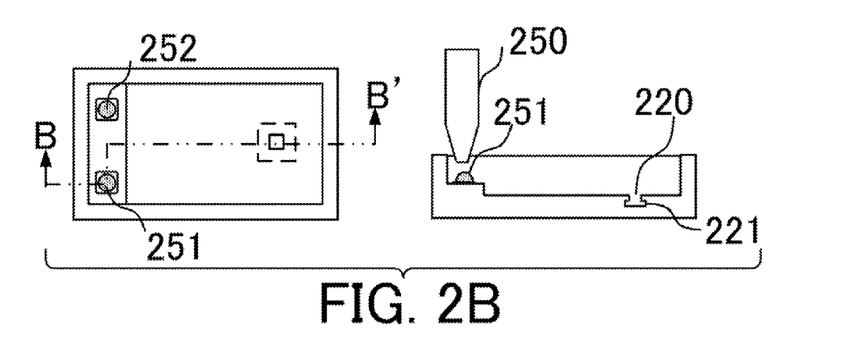

FIG. 2B illustrates a process in which a dispenser 250 is used to eject and apply the conductive adhesives to the metal pads 230 and 240. The conductive adhesives 251 and 252 are ejected onto the metal pads 230 and 240 so as to be raised on the metal pads 230 and 240, respectively.

Figure 2C:
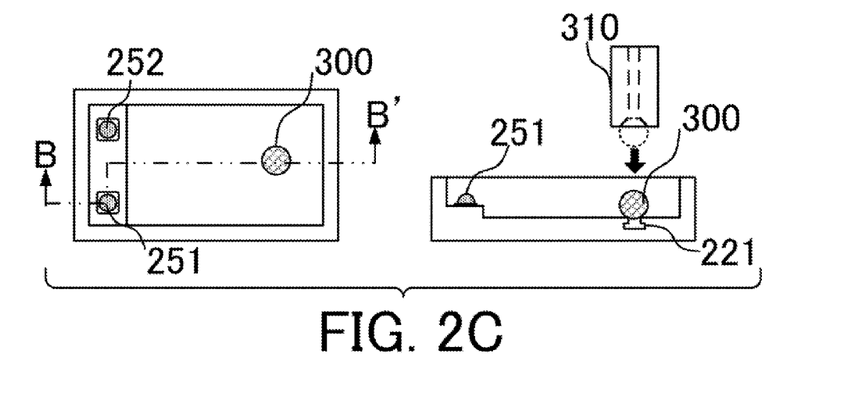

FIG. 2C illustrates a process in which the temporary supporting member 300 is positioned on the opening 220 on the floor surface 215 of the transparent package 200. The temporary supporting member 300 is sucked by a vacuum chuck of a handler 310, and a vacuum state is canceled above the opening 220. As a result, the bottom of the spherical temporary supporting member 300 engages with the opening 220 to determine the position of the temporary supporting member 300. The height of the top of the temporary supporting member 300 placed on the opening 220 is equal to or slightly higher than that of each of the conductive adhesives 251 and 252. In order to provide such a state, the size of the spherical temporary supporting member 300 is preliminarily determined.

Figure 2D:
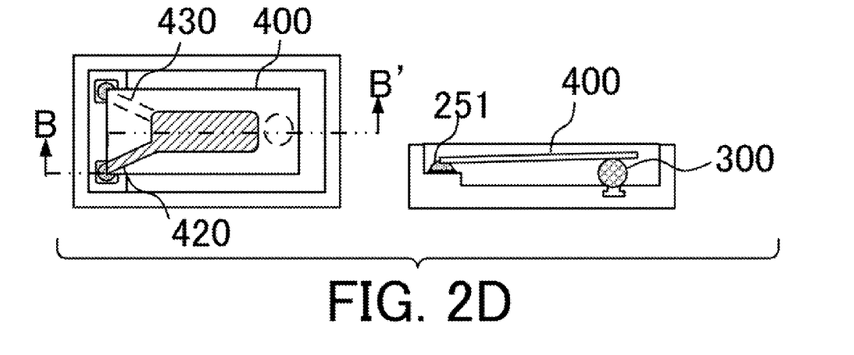

FIG. 2D illustrates a state in which the piezoelectric vibrator 400 is placed over the conductive adhesives 251 and 252 respectively applied to the metal pads 230 and 240, as well as the temporary supporting member 300. The placed piezoelectric vibrator 400 has the free end at a position higher than that of the supported end (inclined leftward). Even when the height of each top of the conductive adhesives 251 and 252 is positioned equal to that of the temporary supporting member 300, because each of the conductive adhesives 251 and 252 is not cured in this state, the supported end of the piezoelectric vibrator 400 is positioned at a slightly low position owing to the weight of the piezoelectric vibrator 400, thereby providing the state of inclined leftward. The piezoelectric vibrator 400 is placed by a handler (not illustrated) similar to the handler 310 such that leading line patterns 420 and 430 formed on the piezoelectric vibrator 400 are respectively aligned with the conductive adhesives 251 and 252 provided on the metal pads 230 and 240. For example, the piezoelectric vibrator 400 is positioned such that the end or end corner of the piezoelectric vibrator 400 overlaps a half to a quarter of each area of the metal pads 230 and 240.

Figure 2E:
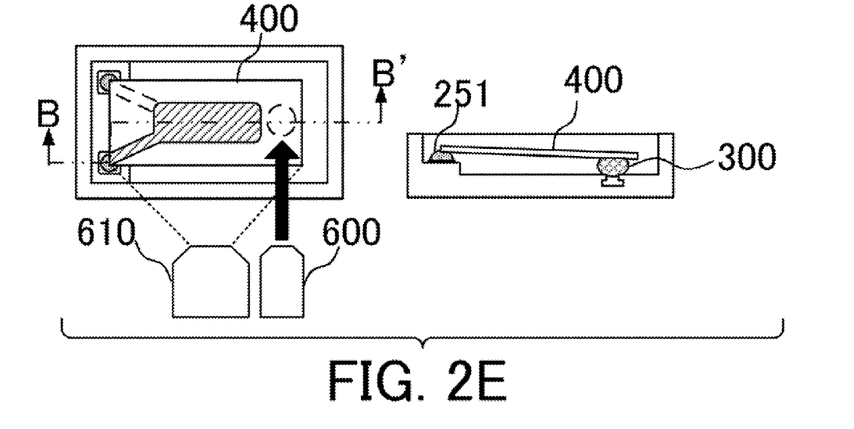

FIG. 2E illustrates a process to adjust the height of the free end of the piezoelectric vibrator 400 inclined leftward. The temporary supporting member 300 is irradiated with a laser, to be thermally softened, from the outside of a side surface of the package 200 through a side wall thereof. Then, the temporary supporting member 300 is deformed owing to the weight of the piezoelectric vibrator 400, thereby decreasing the height of the temporary supporting member 300. The laser irradiation is stopped at the time that the free end is positioned at a height lower than that of the supported end by a predetermined difference (namely, a state is provided, in which the piezoelectric vibrator 400 is inclined rightward). An yttrium aluminum garnet (YAG) laser apparatus 600 is used to radiate the laser to an upper portion (a portion that contacts the piezoelectric vibrator 400) of the temporary supporting member 300. The positions of the two ends of the piezoelectric vibrator 400 are measured with a laser length measuring machine 610 using a Neon-Helium (Ne—He) laser. With the measuring result, the irradiation time or the like by the YAG laser apparatus 600 is controlled, thereby performing adjustment to provide a predetermined height of the piezoelectric vibrator 400. Because the package 200 is transparent, the laser may be radiated through the side surface of the package 200.

The reason for employing the predetermined state in which the piezoelectric vibrator 400 is inclined rightward is that the piezoelectric vibrator 400 will be horizontal in a subsequent process step of curing the conductive adhesives 251 and 252. Namely, with the application of heat during the curing of the conductive adhesives 251 and 252, the viscosity of the conductive adhesives 251 and 252 is temporarily decreased, and the conductive adhesives 251 and 252 becomes slightly squashed owing to the weight of the piezoelectric vibrator 400. Then solvents contained in the conductive adhesives 251 and 252 are volatilized to cause the shrinkage of the conductive adhesives 251 and 252. Because these phenomena enable the free end to be raised, the free end of the piezoelectric vibrator 400 is configured so as to be lowered by the presumed amount of the rise.

Figure 2F:
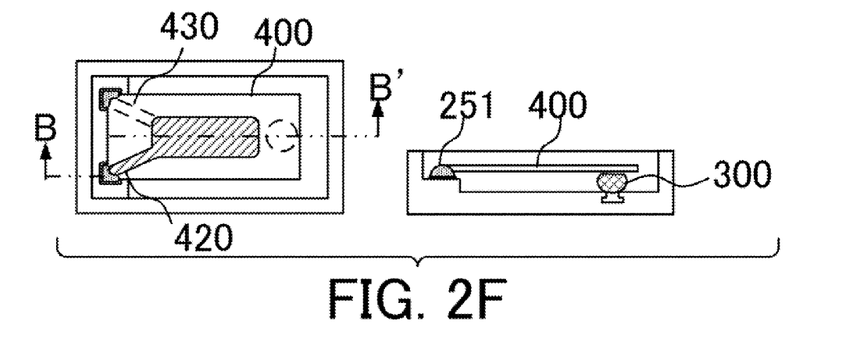

FIG. 2F illustrates a state in which the piezoelectric vibrator 400 is heated to cure the conductive adhesives 251 and 252 after the height adjustment. The heating is performed at a temperature in the range from 150° C. to 180° C. for a predetermined period of time in an electric furnace. As illustrated in FIG. 2F, the piezoelectric vibrator 400 inclined rightward is released from the temporary supporting member 300 owing to the curing and shrinkage of the conductive adhesives 251 and 252, thereby becoming horizontal. The viscosity of the conductive adhesives 251 and 252 is decreased in the initial period of the heating with the result that the conductive adhesives 251 and 252 extend to the upper surface of the piezoelectric vibrator 400. Therefore the conductive adhesive 251 contacts the leading line pattern 420 formed on the upper surface of the piezoelectric vibrator 400. The temporary supporting member 300 is not deformed at such a temperature that the conductive adhesives 251 and 252 are cured (a temperature in the range from 150° C. to 180° C.).

Figure 2G:
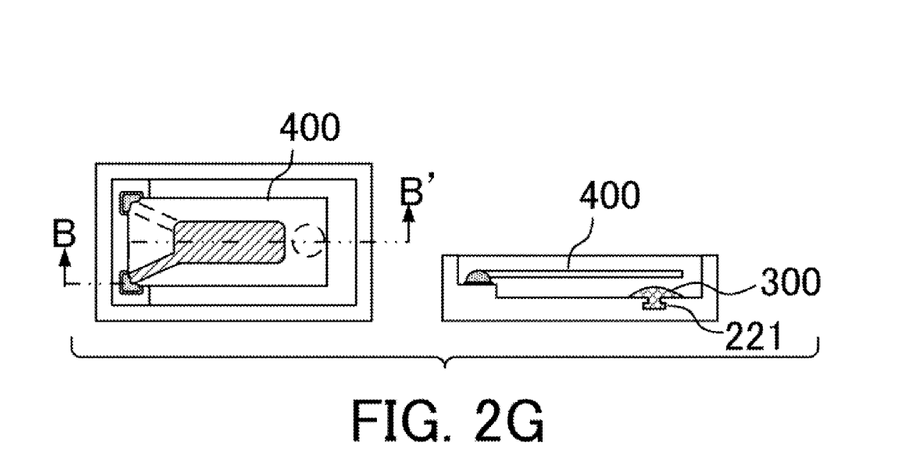

FIG. 2G illustrates a state in which the temporary supporting member 300 is heated to be deformed at a temperature of 300° C. in the electric furnace after the curing of the conductive adhesives 251 and 252. The temporary supporting member 300 enters the hollow portion 221 to be cured.

Figure 2H:
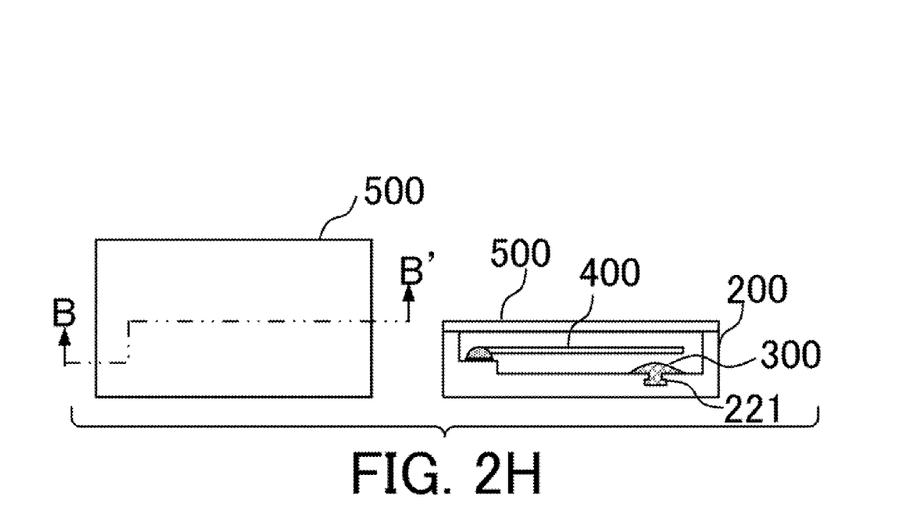

FIG. 2H illustrates a state in which the lid 500 is placed on the package 200 and the piezoelectric oscillator 100 is glass-sealed. The temporary supporting member 300 partially enters the hollow portion 221 to be fixed, and therefore the temporary supporting member 300 does not move about inside the package 200.

Figure 3:
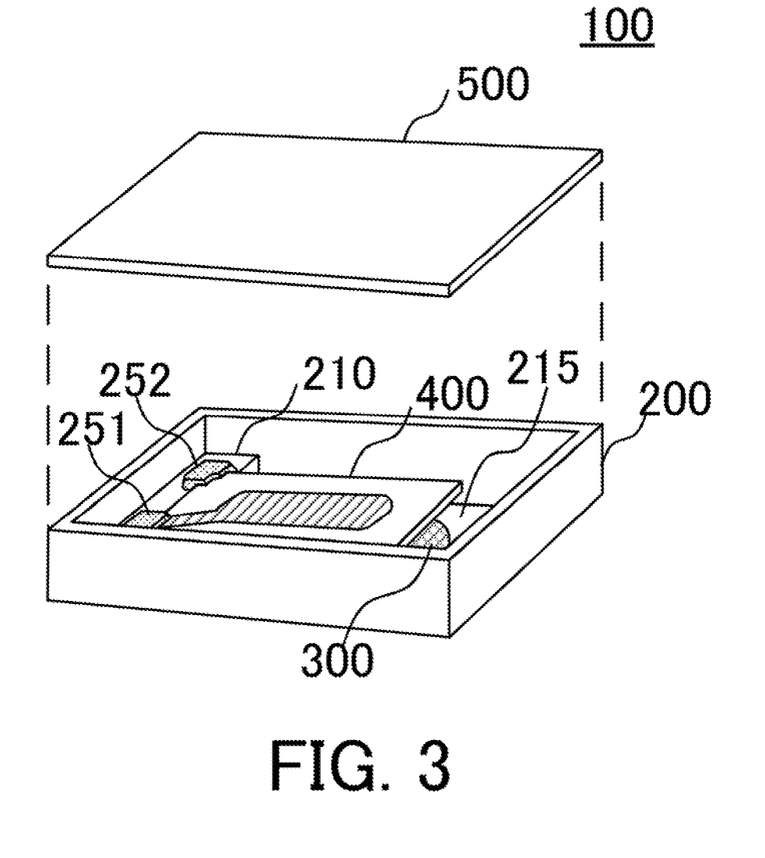
FIG. 3 is a diagram illustrating a perspective view of a piezoelectric oscillator before attachment of a lid according to an embodiment of the present invention.

FIG. 3 illustrates the piezoelectric oscillator 100 before the attachment of the lid 500. One end of the piezoelectric vibrator 400 is supported by the conductive adhesives 251 and 252 applied respectively to the metal pads 230 and 240 provided on the step 210. The temporary supporting member 300, which has been thermally deformed, is found on the floor surface 215 of the package 200 below the free end of the piezoelectric vibrator 400. As discussed above, the temporary supporting member 300 partially enters the hollow portion 221 formed under the floor surface 215, to be fixed, and therefore the temporary supporting member 300 does not move about inside the package 200.

Although transparent ceramic is used for the package 200 in the present embodiment, the transparent material for the package 200 may be transparent hard glass or any other material that is transparent.

In the present embodiment, the height of the piezoelectric vibrator 400 is adjusted before the curing of the conductive adhesives 251 and 252, and therefore one end of the piezoelectric vibrator 400 may be accurately held horizontally after the curing, thereby providing a method for manufacturing a piezoelectric oscillator using a package having a low height.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been discussed in detail, it should be understood that the various changes, substitutions, and alterations could be made hereto without departing from the spirit and scope of the invention.

What is claimed is:

1. A piezoelectric oscillator comprising:
    a package including a floor surface and a step portion thereinside;
    a conductive adhesive applied on the step portion; and
    a piezoelectric vibrator including one end placed on the step portion via the conductive adhesive,
    wherein
    the floor surface is provided with a recess filled with a resin material having a thermal deformation property, the recess has an opening having a predetermined fixed size, the opening leads into a hollow portion having a fixed size larger than the predetermined fixed size, and
    the package includes a sidewall having transparency.

2. The piezoelectric oscillator according to claim 1, wherein
    the package is formed of a transparent ceramic material.

3. The piezoelectric oscillator according to claim 1, wherein
    the sidewall of the package includes a window formed of a transparent hard glass.

* * * * *